United States Patent
Nakahara

[11] Patent Number: 5,519,349
[45] Date of Patent: May 21, 1996

[54] PHASE SHIFTER

[75] Inventor: Kazuhiko Nakahara, Hyogo, Japan

[73] Assignee: Mitsubishi Denki Kabushiki Kaisha, Tokyo, Japan

[21] Appl. No.: 310,322

[22] Filed: Sep. 22, 1994

[30]    Foreign Application Priority Data

Sep. 29, 1993   [JP]   Japan .................... 5-242364

[51] Int. Cl.⁶ .................................................. H03H 11/20
[52] U.S. Cl. ...................... 327/237; 327/232; 327/558; 327/559; 327/554; 333/164; 333/139
[58] Field of Search ..................... 333/139, 164; 327/231, 232, 237, 558, 559, 553, 554

[56]             References Cited

U.S. PATENT DOCUMENTS

| | | | |
|---|---|---|---|
| 4,733,203 | 3/1988 | Ayasli | 333/139 |
| 4,859,972 | 8/1989 | Franke et al. | 333/161 |
| 4,893,035 | 1/1990 | Reynolds et al. | 327/554 |
| 5,148,062 | 9/1992 | Goldfarb | 307/511 |
| 5,168,250 | 12/1992 | Bingham | 333/139 |
| 5,317,290 | 5/1994 | Jacomb-Hood | 333/164 |

FOREIGN PATENT DOCUMENTS

| | | |
|---|---|---|
| 62-142337 | 6/1987 | Japan . |
| 2151113 | 6/1990 | Japan . |
| 2146810 | 6/1990 | Japan . |

OTHER PUBLICATIONS

Robert Coats et al. "A Low Monolithic Five–Bit Pin Diode Phase Shifter" IEEE MTT–S International Microwave Symposium Digest., vol. II, May 1990, New York, pp. 915–918.
Ronald J. Naster et al. "Affordable MMIC Designs for Phased Arrays" Microwave Journal, vol. 30, Mar. 1987, Dedham, pp. 141–150.

*Primary Examiner*—Timothy P. Callahan
*Assistant Examiner*—Dinh T. Le
*Attorney, Agent, or Firm*—Leydig, Voit & Mayer

[57]           ABSTRACT

A phase shifter includes first and second single pole double throw switches, a low-pass filter, and a high-pass filter. The first switch has an input terminal and first and second output terminals, and the second switch has first and second input terminals and an output terminal. The low-pass filter is interposed between the first output terminal of the first switch and the first input terminal of the second switch and includes FETs as capacitors. The high-pass filter is interposed between the second output terminal of the first switch and the second input terminal of the second switch and includes a plurality of FETs as capacitors. The input terminal of first switch and the output terminal of the second switch are an input terminal and an output terminal of the phase shifter, respectively. Each of the high-pass filter and the low-pass filter produces two different phase quantities by the on-off switching of the FETs. Therefore, four different phase quantities are obtained in the phase shifter, i.e., two different phase shift quantities are realized in the phase shifter.

2 Claims, 6 Drawing Sheets

PHASE SHIFTER

FIELD OF THE INVENTION

The present invention relates to a phase shifter including a high-pass filter and a low-pass filter.

BACKGROUND OF THE INVENTION

FIG. 8 is a circuit diagram illustrating a prior art high-pass/low-pass phase shifter. In the figure, a phase shifter 600 comprises two SPDT (Single Pole Double Throw) switches 2 and 26, a low-pass filter 8, and a high-pass filter 9. The low-pass filter 8 is interposed between a first output terminal 3 of the SPDT switch 2 and a first input terminal 27 of the SPDT switch 26. The low-pass filter 8 comprises two inductors 13 and 15 connected in series and a capacitor 14 interposed between the junction of the inductors 13 and 15 and ground. The high-pass filter 9 is interposed between a second output terminal 4 of the SPDT switch 2 and a second input terminal 28 of the SPDT switch 26. The high-pass filter 9 comprises grounded inductors 16 and 18 and a capacitor 17 interposed between the inductors 16 and 18. In this circuit, an input terminal 1 of the SPDT switch 2 and an output terminal 25 of the SPDT switch 26 serve as input and output terminals of the whole circuit.

The SPDT switch 2 includes FETs (Field Effect Transistors) 2a to 2d and resistors 2e to 2h of several kΩ. A gate bias terminal 6 is connected to gates of the FETs 2a and 2d, and a gate bias terminal 7 is connected to gates of the FETs 2b and 2c. The SPDT switch 26 includes FETs 26a to 26d and resistors 26e to 26h of several kΩ. A gate bias terminal 30 is connected to gates of the FETs 26a and 26d, and a gate bias terminal 31 is connected to gates of the FETs 26b and 26c.

A description is given of the operation.

Initially, the FETs 2a and 2d are turned on by a gate bias voltage applied to the gate bias terminal 6, the FETs 2b and 2c are turned off by a gate bias voltage applied to the gate bias terminal 7, the FETs 26a and 26d are turned on by a gate bias voltage applied to the gate bias terminal 30, and the FETs 26b and 26c are turned off by a gate bias voltage applied to the gate bias terminal 31, whereby the first output terminal 3 of the SPDT switch 2 and the first input terminal 27 of the SPDT switch 26 are selected. In this state, a signal applied to the input terminal 1 travels through the first output terminal 3 of the SPDT switch 2, the low-pass filter 8, and the first input terminal 27 of the SPDT switch 26, and it is output from the output terminal 25. At this time, the transmission phase of the signal from the input terminal 1 to the output terminal 25 is delayed, and a variation (θ) in the phase represented by the following formula (1) is produced.

$$\theta = \tan^{-1} - \frac{BN + 2XN + BNXN^2}{2(1 - BNXN)} \quad (1)$$

where XN is the normalized reactance of the inductors 13 and 15, and BN is the normalized susceptance of the capacitor 14.

Then, the FETs 2a and 2d are turned off by a gate bias voltage applied to the gate bias terminal 6, the FETs 2b and 2c are turned on by a gate bias voltage applied to the gate bias terminal 7, the FETs 26a and 26d are turned off by a gate bias voltage applied to the gate bias terminal 30, and the FETs 26b and 26c are turned on by a gate bias voltage applied to the gate bias terminal 31, whereby the second output terminal 4 of the SPDT switch 2 and the second input terminal 28 of the SPDT switch 26 are selected. In this state, a signal applied to the input terminal 1 travels through the second output terminal 4 of the SPDT switch 2, the high-pass filter 9, and the second input terminal 28 of the SPDT switch 26, and it is output from the output terminal 25. At this time, the transmission phase of the signal from the input terminal 1 to the output terminal 25 is advanced, and a variation (θ') of the phase represented by the following formula (2) is produced.

$$\theta' = \tan^{-1} - \frac{Xn + 2Bn + XnBn^2}{2(1 - BnXn)} \quad (2)$$

where Bn is the normalized susceptance of the inductors 16 and 18, and Xn is the normalized reactance of the capacitor 17.

As described above, in the prior art high-pass/low-pass phase shifter, the SPDT switches 2 and 26 select one of the two signal transmission paths from the input terminal 1 to the output terminal 25, i.e., the path through the low-pass filter 8 and the path through the high-pass shifter 9, whereby two phase quantities, i.e., one phase shift quantity, are obtained.

In the prior art high-pass/low-pass phase shifter, however, only one phase shift quantity is obtained in one phase shifter. Therefore, when a multiple bit phase shifter is fabricated using the high-pass/low-pass phase shifter, a plurality of the high-pass/low-pass phase shifters that are designed to have different phase shift quantities must be connected in series, increasing chip size. Further, the number of the SPDT switches increases with an increase in the bit number, whereby the signal transmission loss increases.

SUMMARY OF THE INVENTION

An object of the present invention is to provide a phase shifter that produces a plurality of phase shift quantities.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, in a high-pass/low-pass phase shifter, a high-pass filter and a low-pass filter include FETs as capacitors. Each of the high-pass filter and the low-pass filter produces two different phase quantities by the on-off switching of the FETs. Therefore, four different phase quantities are obtained in the phase shifter, i.e., two different phase shift quantities are realized in the phase shifter.

According to a second aspect of the present invention, in a vector composition type phase shifter including a high-pass filter and a low-pass filter, each of the high-pass filter and the low-pass filter includes variable capacitors and inductances. In this structure, the difference in phase quantities between a signal passing through the high-pass filter and a signal passing through the low-pass filter, i.e., the phase shift quantity, can be varied by controlling the capacitances of the variable capacitors. Therefore, a plurality of phase shift quantities are obtained in the phase shifter.

DETAILED DESCRIPTION OF THE PREFERRED EMBODIMENTS

Figure 1:
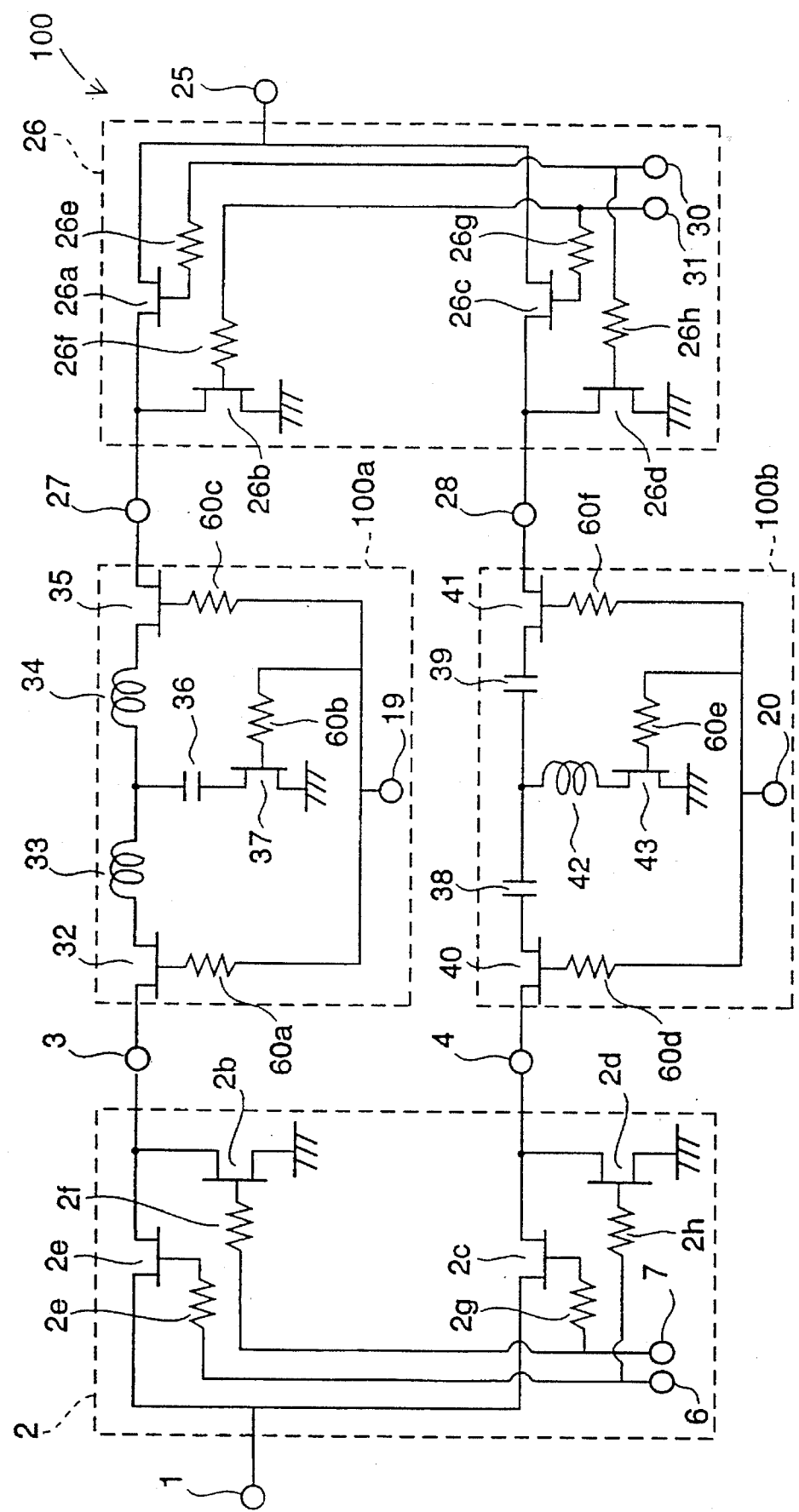
FIG. 1 is a circuit diagram illustrating a high-pass/low-pass phase shifter in accordance with a first embodiment of the present invention.

FIG. 1 is a circuit diagram illustrating a high-pass/low-pass phase shifter in accordance with a first embodiment of the present invention. In the figure, the same reference numerals as in FIG. 6 designate the same or corresponding parts. In FIG. 1, a low-pass filter 100a is interposed between the first output terminal 3 of the SPDT switch 2 and the first input terminal 27 of the SPDT switch 26, and a high-pass filter 100b is interposed between the second output terminal 4 of the SPDT switch 2 and the second input terminal 28 of the SPDT switch 26.

In the low-pass filter 100a, reference numerals 33 and 34 designate inductors, numerals 32, 35, and 37 designate FETs, numeral 36 designates a capacitor, and numerals 60a to 60c designate resistors of several kΩ. A source (or drain) of the FET 32 is connected to the output terminal 3 of the SPDT switch 2, and a drain (or source) of the FET 32 is connected to an input end of the inductor 33. A source (or drain) of the FET 35 is connected to the input terminal 27 of the SPDT switch 26, and a drain (or source) of the FET 35 is connected to an output end of the inductor 34. An output end of the inductor 33 is connected to an input end of the inductor 34, and the junction of these inductors 33 and 34 is connected to an input side electrode of the capacitor 36, and an output side electrode of the capacitor 36 is connected to a source (or drain) of the FET 37 the drain (or source) of which is connected to ground. Gates of the FETs 32, 35, and 37 are connected to the gate bias terminal 19 through the resistors 60a, 60b, and 60c, respectively.

In the high-pass filter 100b, reference numerals 38 and 39 designate capacitors, numerals 40, 41, and 43 designate FETs, numeral 42 designates an inductor, and numerals 60d to 60f designate resistors of several kΩ. A source (or drain) of the FET 40 is connected to the second output terminal 4 of the SPDT switch 2, and a drain (or source) of the FET 40 is connected to an input side electrode of the capacitor 38. A source (or drain) of the FET 41 is connected to the input terminal 28 of the SPDT switch 26, and a drain (or source) of the FET 41 is connected to an output side electrode of the capacitor 39. An output side electrode of the capacitor 38 is connected to an input side electrode of the capacitor 39, and the junction between these capacitors 38 and 39 is connected to an input end of the inductor 42. An output end of the inductor 42 is connected to a source (or drain) of the FET 43 the drain (or source) of which is connected to ground. Gates of the FETs 40, 41, and 43 are connected to the gate bias terminal 20 through the resistors 60d, 60e, and 60f, respectively.

Figure 4:
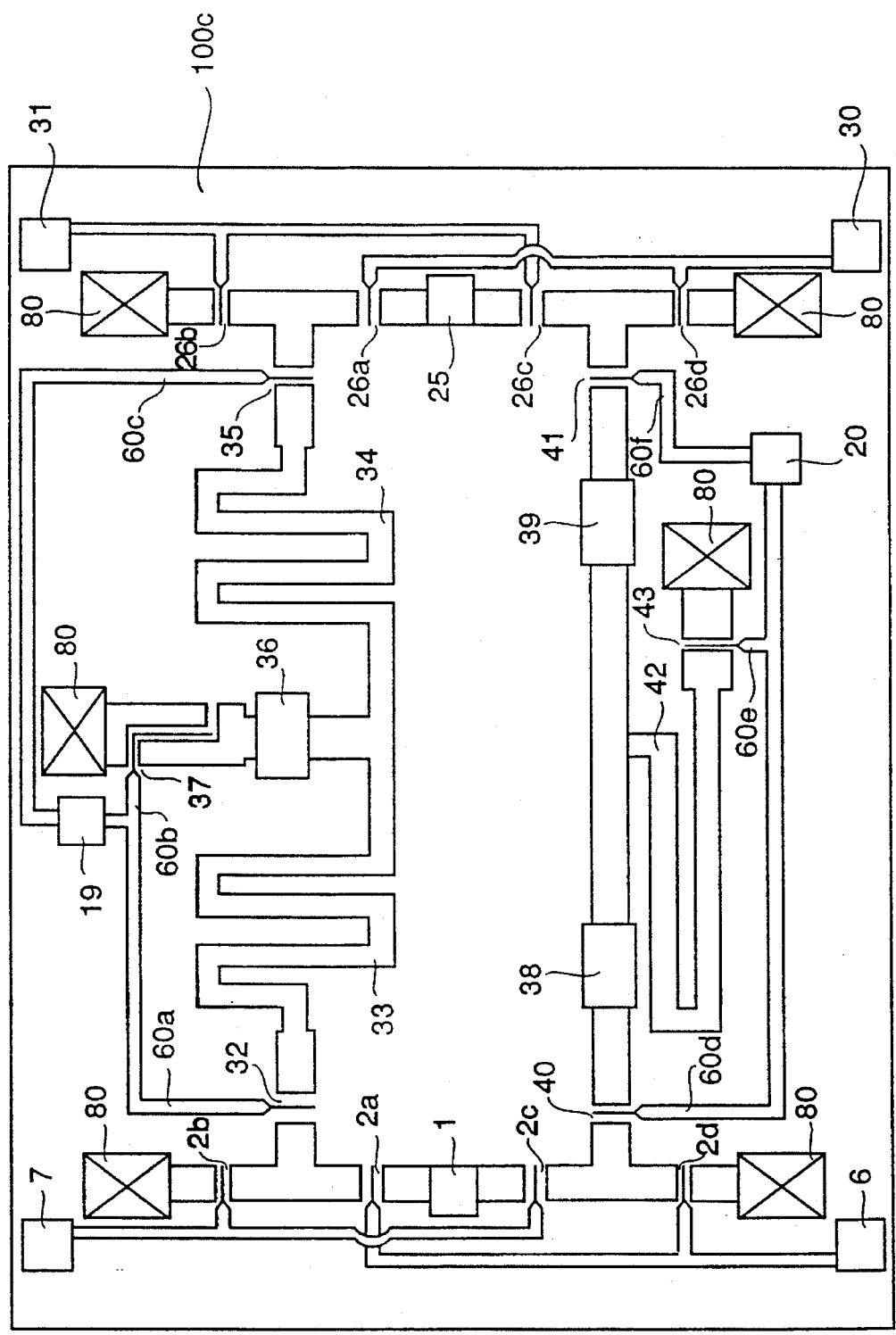
FIG. 4 is a plan view illustrating a pattern of the high-pass/low-pass phase shifter shown in FIG. 1.

FIG. 4 is a plan view illustrating a pattern of the high-pass/low-pass phase shifter 100 as a monolithic microwave integrated circuit. In the figure, the same reference numerals as in FIG. 1 designate the same or corresponding parts. Reference numeral 80 designates ground pads, and numeral 100c designates a substrate.

A description is given of the operation.

Figure 2A:
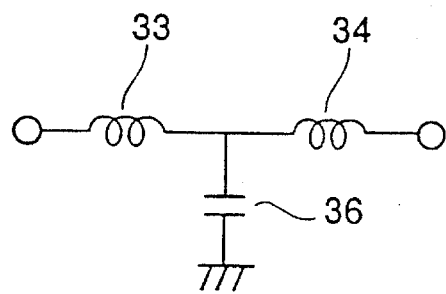
FIGS. 2(a) and 2(b) are equivalent circuit diagrams of the low-pass filter shown in FIG. 1 in an ON state of the FETs and an OFF state of the FETs, respectively.
Figure 2B:
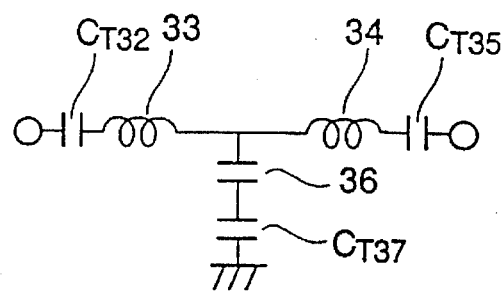

FIGS. 2(a) and 2(b) are equivalent circuit diagrams of the low-pass filter 100a when the FETs 32, 35, and 37 are turned on and when these FETs are turned off, respectively. In FIG. 2(a), since the FETs 32, 35, and 37 are in the ON state, i.e., the gate bias voltage $V_g$ is 0 V, these FETs have no loss. On the other hand, in FIG. 2(b), since the FETs 32, 35, and 37 are in the OFF state, i.e., the gate bias voltage $V_g$ is smaller than the pinch-off voltage $V_p$, the FETs 32, 35, and 37 have capacitances CT32, CT35, and CT37, respectively.

Figure 3A:
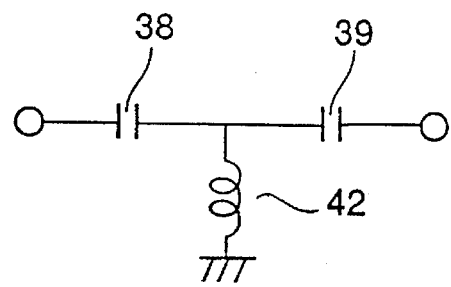
FIGS. 3(a) and 3(b) are equivalent circuit diagrams of the high-pass filter shown in FIG. 1 in an ON state of the FETs and an OFF state of the FETs, respectively.
Figure 3B:
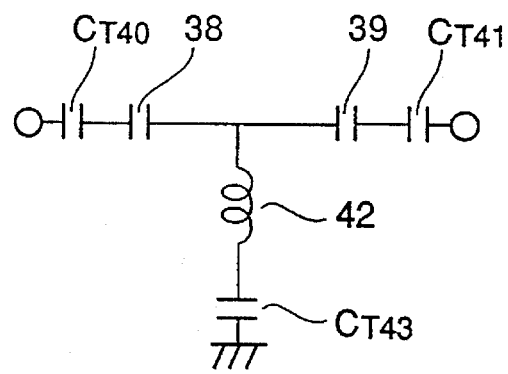

FIGS. 3(a) and 3(b) are equivalent circuit diagrams of the high-pass filter 100b when the FETs 40, 41, and 43 are turned on and when these FETs are turned off, respectively. In FIG. 3(a), since the FETs 40, 41, and 43 are in the ON state, i.e., the gate bias voltage $V_g$ is 0 V, these FETs have no loss. On the other hand, in FIG. 3(b), since the FETs 40, 41, and 43 are in the OFF state, i.e., the gate bias voltage $V_g$ is smaller than the pinch-off voltage $V_p$, the FETs 40, 41, and 43 have capacitances CT40, CT41, and CT43, respectively.

The operation of the phase shifter 100 when a signal applied to the input terminal 1 is output from the terminal 25 through the low-pass filter 100a will be described.

Figure 8:
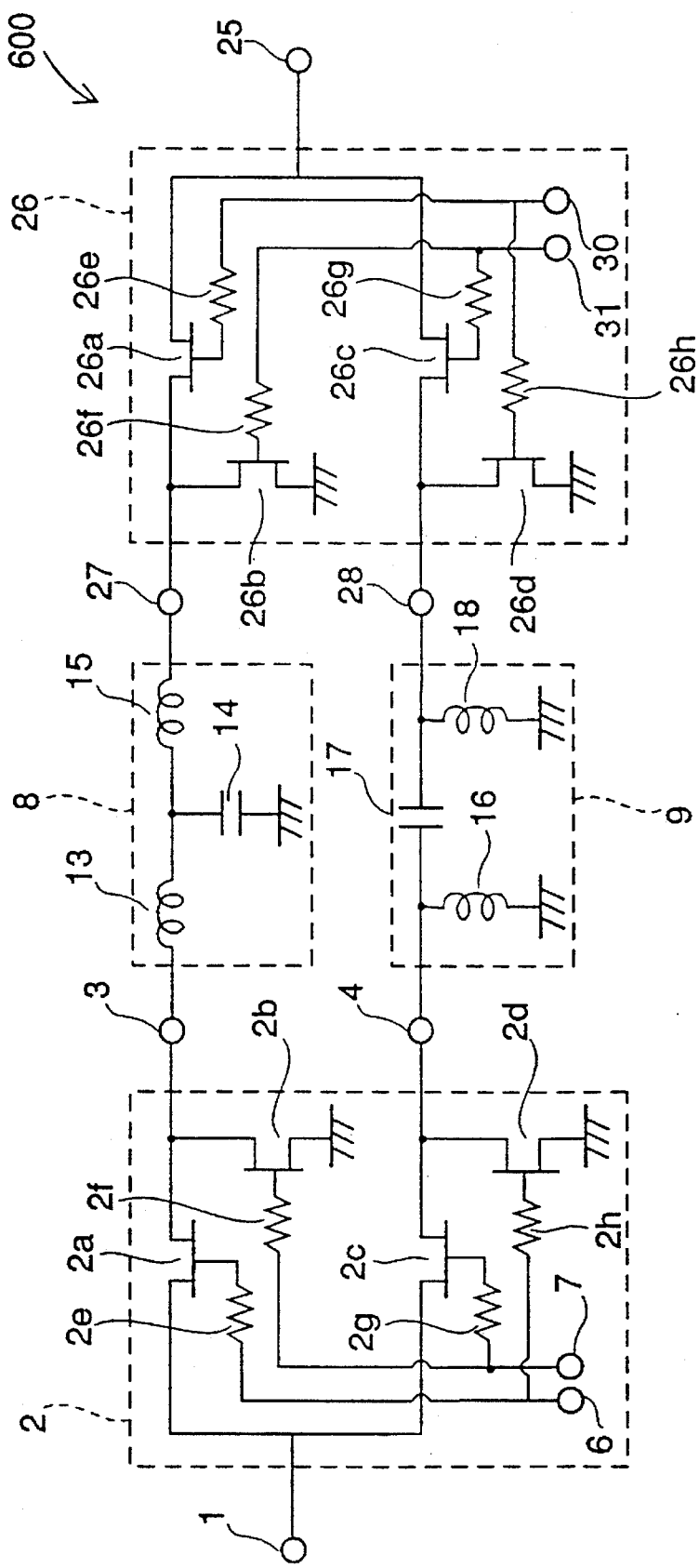
FIG. 8 is a circuit diagram illustrating a high-pass/low-pass phase shifter according to the prior art.

Initially, the first output terminal 3 of the SPDT switch 2 and the first input terminal 27 of the SPDT switch 26 are selected in the same way as described with respect to FIG. 8, whereby the FETs 32, 35, and 37 are turned on. In this state, a signal applied to the input terminal 1 is transmitted through the output terminal 3 of the SPDT switch 2, the low-pass filter 100a shown in FIG. 2(a), and the input terminal 27 of the SPDT switch 26 to the output terminal 25. At this time, the transmission phase of the signal is delayed, and a variation (θ1) of the phase quantity represented by the following formula (3) is produced.

$$\theta1 = \tan^{-1} - \frac{BN1 + 2XN1 + BN1XN1^2}{2(1 - BN1XN1)} \quad (3)$$

where XN1 is the normalized reactance of the inductors 33 and 34, and BN1 is the normalized susceptance of the capacitor 36.

Thereafter, the FETs 32, 35, and 37 are turned off. In this state, the signal applied to the input terminal 1 is transmitted through the first output terminal 3 of the SPDT switch 2, the low-pass filter 100a shown in FIG. 2(b), and the input terminal 27 of the SPDT switch 26 to the output terminal 25. The transmission phase of the signal is delayed, and a variation (θ2) of the phase quantity represented by the following formula (4) is produced.

$$\theta2 = \tan^{-1} - \frac{BN2 + 2XN2 + BN2XN2^2}{2(1 - BN2XN2)} \quad (4)$$

where XN2 is the normalized reactance of the serially-connected FET 32 (capacitance CT32) and inductor 33 and the serially-connected FET 35 (capacitance CT35) and inductor 34, and BN2 is the normalized susceptance of the serially-connected FET 37 (capacitance CT37) and capacitor 36.

As described above, by the on-off switching of the FETs 32, 35, and 37 included in the low-pass filter 100a, two different phase quantities are obtained.

The operation of the phase shifter 100 when a signal applied to the input terminal 1 is output from the terminal 25 through the low-pass filter 100b will be described.

Initially, the second output terminal 4 of the SPDT switch 2 and the second input terminal 28 of the SPDT switch 26 are selected in the same way as described with respect to FIG. 8 to turn on the FETs 40, 41, and 43. In this state, a signal applied to the input terminal 1 is transmitted through the output terminal 4 of the SPDT switch 2, the low-pass filter 100b shown in FIG. 3(a), and the input terminal 28 of the SPDT switch 26 to the output terminal 25. At this time, the transmission phase Of the signal is advanced, and a variation (θ3) of the phase quantity represented by the following formula (5) is produced.

$$\theta 3 = \tan^{-1} - \frac{XN3 + 2BN3 + XN3BN3^2}{2(1 - BN3XN3)} \quad (5)$$

where XN3 is the normalized reactance of the capacitors 38 and 38, and BN3 is the normalized susceptance of the inductor 42.

Then, the FETs 40, 41, and 43 are turned off. In this state, the signal applied to the input terminal 1 is transmitted through the second output terminal 4 of the SPDT switch 2, the low-pass filter 100b shown in FIG. 3(b), and the second input terminal 28 of the SPDT switch 26 to the output terminal 25. The transmission phase of the signal is advanced, and a variation (θ4) of the phase quantity represented by the following formula (6) is produced.

$$\theta 4 = \tan^{-1} - \frac{XN4 + 2BN4 + XN4BN4^2}{2(1 - BN4XN4)} \quad (6)$$

where XN4 is the normalized reactance of the serially-connected FET 40 (capacitance CT40) and capacitor 38 and the serially-connected FET 41 (capacitance CT41) and capacitor 39, and BN4 is the normalized susceptance of the serially-connected FET 43 (capacitance CT43) and inductor 42.

As described above, by the on-off switching of the FETs 40, 41, and 43 included in the low-pass filter 100b, two different phase quantities are obtained.

In the high-pass/low-pass phase shifter 100 according to the first embodiment of the invention, each of the low-pass filter 100a and the high-pass filter 100b produces two different phase quantities. It is assumed that the constituents of the low-pass filter 100a, i.e., the inductors 33 and 34, the capacitor 36, and the FETs 32, 35, and 37, are designed so that the two phase quantities θ1 and θ2 produced in the low-pass filter 100a are −67.5° and −22.5°, respectively, and the constituents of the high-pass filter 100b, i.e., the inductor 42, the capacitor 38 and 39, and the FETs 40, 41, and 43, are designed so that the two phase quantities θ3 and θ4 produced in the high-pass filter 100b are 22.5° and 67.5°, respectively. In this case, the phase shifter 100 realizes an operation equivalent to operation of a conventional 45° bit high-pass/low-pass phase shifter and 90° bit high-pass/low-pass phase shifter. As a result, a two-bit phase shifter with reduced chip size compared to the conventional shifter is realized. Further, since the phase shifter 100 includes two SPDT switches through which signals travel, the signal transmission loss is significantly reduced compared to two conventional serially-connected high-pass/low-pass phase shifters including four SPDT switches.

Figure 5:
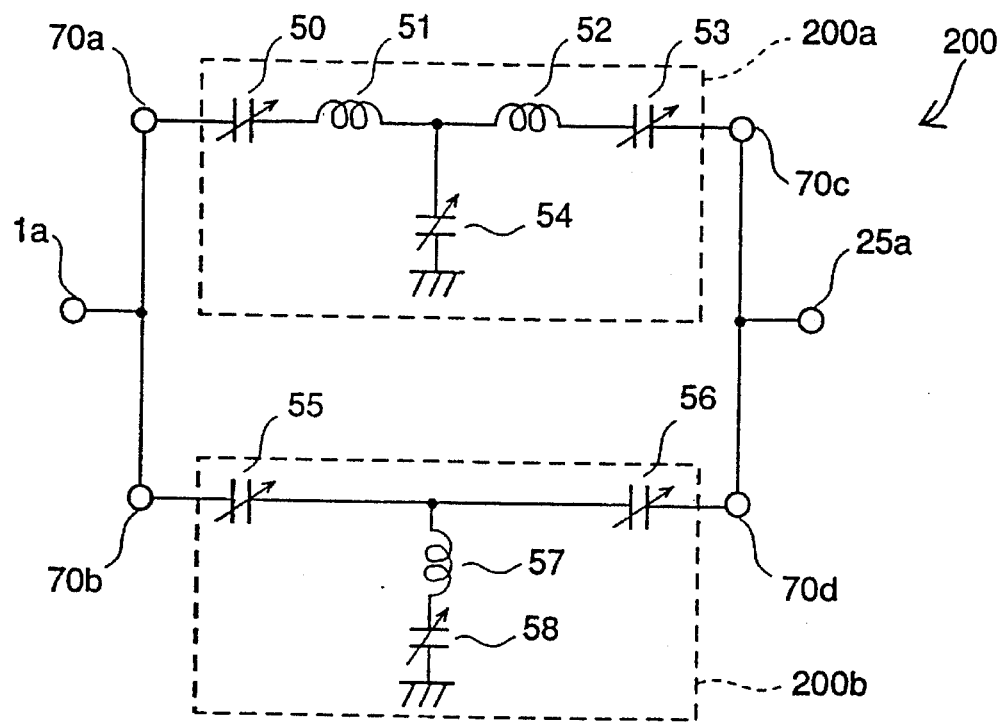
FIG. 5 is a circuit diagram of a phase shifter in accordance with a second embodiment of the present invention.

FIG. 5 is a circuit diagram of a vector composition type phase shifter using a low-pass filter and a high-pass filter according to a second embodiment of the present invention. In the figure, a phase shifter 200 comprises a low-pass filter 200a and a high-pass filter 200b. An input terminal 1a of the phase shifter 200 is connected to an input node 70a of the low-pass filter 200a and to an input node 70b of the high-pass filter 200b. An output node 70c of the low-pass filter 200a and an output node 70d of the high-pass filter 200b are connected to an output terminal 25a of the phase shifter 200.

In the low-pass filter 200a, reference numerals 50, 53, and 54 designate variable capacitors, and numerals 51 and 52 designate inductors. An input side electrode of the variable capacitor 50 is connected to the input node 70a of the low-pass filter 200a, and an output side electrode of the variable capacitor 50 is connected to an input end of the inductor 51. An output end of the inductor 51 is connected to an input end of the inductor 52. An output end of the inductor 52 is connected to an input side electrode of the variable capacitor 53. An output side electrode of the variable capacitor 53 is connected to the output node 70c of the low-pass filter 200a. A junction of the inductors 51 and 52 is connected to an input side electrode of the variable capacitor 54 whose output side electrode is connected to ground.

In the high-pass filter 200b, reference numerals 55, 56, and 58 designate variable capacitors, and numeral 57 designates an inductor. An input side electrode of the variable capacitor 55 is connected to the input node 70b of the high-pass filter 200b, and an output side electrode of the variable capacitor 55 is connected to an input side electrode of the variable capacitor 56. An output side electrode of the variable capacitor 56 is connected to the output node 70d of the high-pass filter 200b. A junction of the variable capacitors 55 and 56 is connected to an input end of the inductor 57. An output end of the inductor 57 is connected to an input side electrode of the variable capacitor 58, and an output side electrode of the variable capacitor 58 is grounded.

The variable capacitors 50, 53~56, and 58 are FETs each having a source (or a drain) as the input side electrode and a drain (or a source) as the output side electrode. The capacitance of each FET is varied according to a gate bias voltage applied to a gate of the FET.

Figure 7:
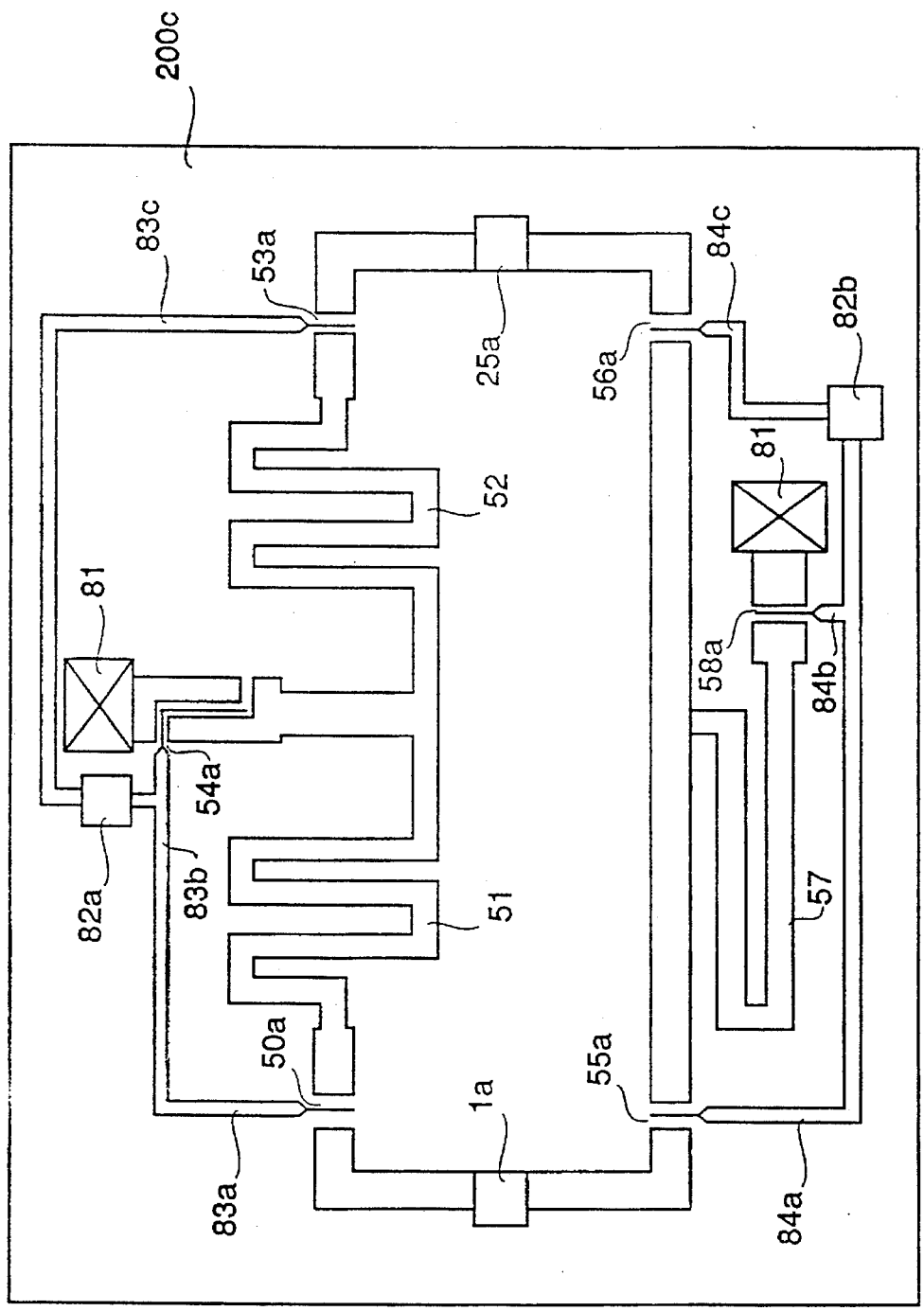
FIG. 7 is a plan view illustrating a pattern of the phase shifter shown in FIG. 5.

FIG. 7 is a plan view illustrating a pattern of the phase shifter shown in FIG. 5 as a monolithic microwave integrated circuit. In the figure, the same reference numerals as in FIG. 5 designate the same or corresponding parts. Reference numerals 50a, 53a, 54a, 55a, 56a, and 58a designate FETs, numeral 81 designates a ground pad, numeral 82a designates a gate bias terminal connected to gates of the FETs 50a, 53a, and 54a, numeral 82b designates a gate bias terminal connected to gates of the FETs 55a, 56a, and 58a, numerals 83a~83c and 84a~84c designate resistors of several kΩ, and numeral 200c designates a substrate.

A description is given of the operation.

The low-pass filter 200a comprising the variable capacitors 50, 53, and 54 and the inductors 51 and 52 is represented in an ABCD matrix as follows:

$$\begin{pmatrix} 1 & j\omega XL \\ 0 & 1 \end{pmatrix} \begin{pmatrix} 1 & 0 \\ j\omega BL & 1 \end{pmatrix} \begin{pmatrix} 1 & j\omega XL \\ 0 & 1 \end{pmatrix} = \quad (7)$$

$$\begin{pmatrix} 1 - \omega^2 XLBL & (1 - \omega^2 XLBL)j\omega XL + j\omega XL \\ j\omega BL & 1 - \omega^2 XLBL \end{pmatrix}$$

where XL is the reactance of the serially-connected variable capacitor 50 and inductor 51 and the serially-connected variable capacitor 53 and inductor 52, and BL is the susceptance of the variable capacitor 54. Assuming that the transmission phase quantity of the low-pass filter is vL, the following equations (8) and (9) are obtained from the ABCD matrix (7).

$$\cos\theta L = 1 - \omega^2 XLBL \quad (8)$$

$$\sin\theta L = -\omega BLZL \quad (9)$$

Assuming that θL is −45°, the following equations (10) and (11) are obtained from the equation (9).

$$-\frac{1}{\sqrt{2}} = -\omega BLZL \quad (10)$$

$$BL = \frac{1}{\omega\sqrt{2}\ ZL} \quad (11)$$

where ω is the angular frequency (ω=2πf), and ZL is the input/output impedance of the low-pass filter.

On the other hand, the high-pass filter 200b comprising the variable capacitors 55, 56, and 58 and the inductor 57 is represented in an ABCD matrix as follows:

$$\begin{pmatrix} 1 & \frac{1}{j\omega XH} \\ 0 & 1 \end{pmatrix} \begin{pmatrix} 1 & 0 \\ \frac{1}{j\omega BH} & 1 \end{pmatrix} \begin{pmatrix} 1 & \frac{1}{j\omega XH} \\ 0 & 1 \end{pmatrix} = \quad (12)$$

$$\begin{pmatrix} 1 - \frac{1}{\omega^2 XHBH} & \left(1 - \frac{1}{\omega^2 XHBH}\right) \frac{1}{j\omega XH} + \frac{1}{j\omega XH} \\ \frac{1}{j\omega BH} & 1 - \frac{1}{\omega^2 XHBH} \end{pmatrix}$$

where XH is the reactance of the variable capacitors 55 and 56, and BH is the susceptance of the serially-connected inductor 57 and variable capacitor 58.

Assuming that the transmission phase quantity of the high-pass filter is θH, the following equations (13) and (14) are obtained from the ABCD matrix (12).

$$\cos\theta H = 1 - 1/\omega^2 XHBH \quad (13)$$

$$\sin\theta H = -ZH/\omega BH \quad (14)$$

Assuming that θH is − 45°, the following equations (15) and (16) are obtained from the equation (14).

$$\frac{1}{\sqrt{2}} = -\frac{1}{\omega BH} ZH \quad (15)$$

$$BH = -\frac{\sqrt{2}}{\omega} ZH \quad (11)$$

where ω is the angular frequency (ω=2πδ), and ZH is the input/output impedance of the high-pass filter.

Figure 6:
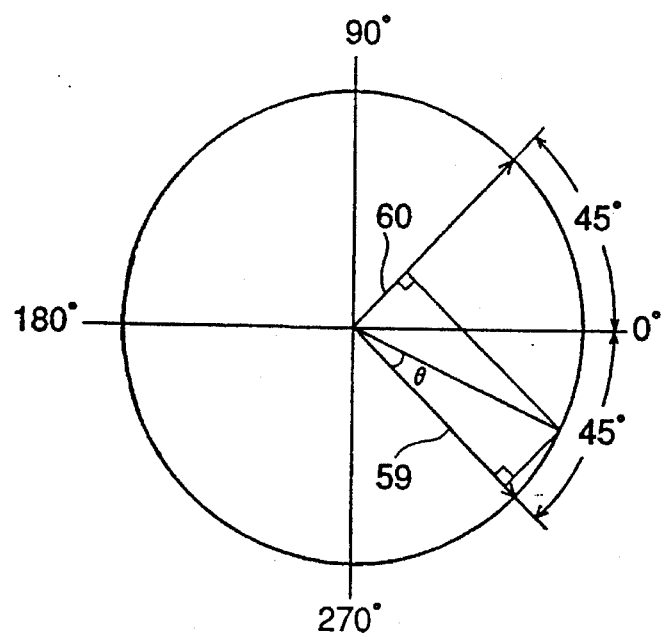
FIG. 6 is a vector diagram for explaining the operation of the phase shifter shown in FIG. 5.

FIG. 6 is a diagram for explaining the phase shift quantity of the phase shifter 200. In the figure, a signal component 59 passing through the low-pass filter 200a and a signal component 60 passing through the high-pass filter 200b are compounded, whereby the phase shift quantity, i.e., the variation θ in the phase quantity, is achieved. The power distribution of these signal components is controlled by BL and BH. In addition, the transmission phase quantities of the low-pass filter 200a and the high-pass filter 200b are −45° and 45°, respectively.

Further, since the input/output impedance of this phase shifter is 50 Ω, the following equations (17), (18), and (19) apply.

$$\frac{1}{ZH} + \frac{1}{ZL} = \frac{1}{50} \quad (17)$$

$$\frac{ZH}{ZL} = k = \tan\theta \quad (18)$$

$$ZL = \frac{1+k}{k} \times 50 \quad (19)$$

As described above, in the phase shifter 200 according to the second embodiment of the invention, when the phase shift quantity, i.e., the variation θ in the phase quantity, is determined, the input/output impedances ZL and ZH are obtained according to the equations (17)~(19). From the input/output impedances ZL and ZH, the reactance XL and the susceptance BL of the low-pass filter 200a are obtained according to the equations (8)~(11), and the reactance XH and the susceptance BH of the high-pass filter 200b are obtained according to the equations (13)~(16).

Therefore, in the phase shifter 200, the capacitances of the variable capacitors included in the low-pass filter 200a and the high-pass filter 200b are controlled to desirably adjust the reactance XL and the susceptance BL of the low-pass filter 200a and the reactance XH and the susceptance BH of the high-pass filter 200b, whereby the phase shift quantity can be varied. As the result, a plurality of phase shift quantities are realized in one phase shifter. For example, when the capacitances of the variable capacitors are controlled so that two phase shift quantities of 11.25° and 22.5° are obtained in the phase shifter, the phase shifter realizes an operation equivalent to operations of a conventional 11.25° bit high-pass/low-pass phase shifter and a conventional 22.5° bit high-pass/low-pass phase shifter. As the result, a two-bit phase shifter with reduced chip size compared to the conventional shifter is realized.

Further, a multiple-bit phase shifter is realized using the phase shifters according to the first and second embodiments of the invention. For example, when a conventional 180° bit high-pass/low-pass phase shifter, a two bit, i.e., 45° and 90°, high-pass/low-pass phase shifter according to the first embodiment, and a two bit, i.e., 11.25° and 22.5°, phase shifter are connected in series, a five bit phase shifter is realized by the three phase shifters, whereby the chip size is significantly reduced compared to a conventional five bit phase shifter.

While in the above-described second embodiment FETs are employed as the variable capacitors, varactor diodes may be employed in place of the FETs.

What is claimed is:

1. A phase shifter comprising:

first and second single pole double throw switches, the first switch having an input terminal and first and second output terminals and the second switch having first and second input terminals and an output terminal;

a low-pass filter interposed between the first and second switches, said low-pass filter comprising first, second and third FETs, each FET having a source electrode, a drain electrode, and a gate electrode, first and second inductors, each inductor having an input end and an output end, and a first capacitor having a first electrode and a second electrode, wherein one of the source or drain electrode of the first FET is connected to the first output terminal of the first switch and the other of the source or drain electrode of the first FET is connected to the input end of the first inductor, the output end of the first inductor is connected to the input end of the second inductor, one of the source or drain electrode of the second FET is connected to the output end of the second inductor and the other of the source or drain electrode of the second FET is connected to the first input terminal of the second switch, the junction between the first and second inductors is connected to the first electrode of the first capacitor, one of the source or drain electrode of the third FET is connected to the second electrode of the first capacitor, the other of the source or drain electrode of the third FET is connected to ground, and the gate electrodes of the first, second, and third FETs are connected together to a first control electrode for turning the first, second, and third FETs on and off;

a high-pass filter interposed between the first and second switches, said high-pass filter comprising fourth, fifth and sixth FETs, each FET having a source electrode, a drain electrode, and a gate electrode, second and third capacitors, each capacitor having a first electrode and a second electrode, and a third inductor having an input end and an output end, wherein one of the source or drain electrode of the fourth FET is connected to the second output terminal of the first switch and the other of the source or drain electrode of the fourth FET is connected to the first electrode of the second capacitor, the second electrode of the second capacitor is connected to the first electrode of the third capacitor, one of the source or drain electrode of the fifth FET is connected to the second electrode of the third capacitor and the other of the source or drain electrode of the fifth FET is connected to the second input terminal of the second switch, the junction between the second and third capacitors is connected to the input end of the third inductor, and one of the source or drain electrode of the sixth FET is connected to the output end of the third inductor and the other of the source or drain electrode of the sixth FET is connected to ground, the input terminal of the first switch being an input terminal of the phase shifter, the output terminal of the second switch being an output terminal of the phase shifter, and the gate electrodes of the fourth, fifth, and sixth FETs are connected together to a second control electrode for turning the fourth, fifth, and sixth FETs on and off.

2. A phase shifter comprising:

an input terminal and an output terminal;

a low-pass filter comprising first, second, and third variable capacitors, each variable capacitor having a first electrode and a second electrode, and first and second inductors, each having an input end and an output end, wherein the first electrode of the first variable capacitor is connected to the input terminal, the second electrode of the first variable capacitor is connected to the input end of the first inductor, the output end of the first inductor is connected to the input end of the second inductor, the output end of the second inductor is connected to the first electrode of the second variable capacitor, the second electrode of the second variable capacitor is connected to the output terminal, the first electrode of the third variable capacitor is connected to the junction of the first and second inductors, and the second electrode of the third variable capacitor is connected to ground;

a high-pass filter comprising fourth, fifth, and sixth variable capacitors, each variable capacitor having a first electrode and a second electrode, and a third inductor having an input end and an output end, wherein the first electrode of the fourth variable capacitor is connected to the input terminal, the second electrode of the fourth variable capacitor is connected to the first electrode of the fifth variable capacitor, the second electrode of the fifth variable capacitor is connected to the output terminal, the input end of the third inductor is connected to the junction of the fourth and fifth variable capacitors, the output end of the third inductor is connected to the first electrode of the sixth variable capacitor, and the second electrode of the sixth variable capacitor is connected to ground.

* * * * *